United States Patent
McCartney et al.

(10) Patent No.: US 11,604,229 B2
(45) Date of Patent: Mar. 14, 2023

(54) TECHNIQUES FOR DETERMINING ENERGY STORAGE DEVICE STATE OF HEALTH

(71) Applicant: Analog Devices International Unlimited Company, Limerick (IE)

(72) Inventors: Damien J. McCartney, Raheen (IE); Hongxing Li, Andover, MA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/402,200

(22) Filed: Aug. 13, 2021

(65) Prior Publication Data

US 2022/0206077 A1      Jun. 30, 2022

Related U.S. Application Data

(60) Provisional application No. 63/131,047, filed on Dec. 28, 2020.

(51) Int. Cl.
| | | |
|---|---|---|
| *G01R 31/392* | (2019.01) | |
| *G01R 31/3842* | (2019.01) | |
| *H02J 7/00* | (2006.01) | |
| *H03F 3/00* | (2006.01) | |

(52) U.S. Cl.
CPC ....... *G01R 31/392* (2019.01); *G01R 31/3842* (2019.01); *H02J 7/005* (2020.01); *H03F 3/005* (2013.01); *H02J 7/0013* (2013.01)

(58) Field of Classification Search
None
See application file for complete search history.

(56) References Cited

U.S. PATENT DOCUMENTS

| | | | |
|---|---|---|---|
| 6,424,157 B1 | 7/2002 | Gollomp et al. | |
| 6,424,158 B2 | 7/2002 | Klang | |
| 6,549,014 B1 | 4/2003 | Kutkut et al. | |
| 6,611,774 B1 | 8/2003 | Zaccaria | |

(Continued)

FOREIGN PATENT DOCUMENTS

| | | | |
|---|---|---|---|
| CN | 102288919 B | 6/2013 | |
| CN | 106026341 A | 10/2016 | |

(Continued)

OTHER PUBLICATIONS

"Simplifying Current Sensing", Texas Instruments Inc., (2020), 58 pgs.

(Continued)

*Primary Examiner* — Jas A Sanghera
(74) *Attorney, Agent, or Firm* — Schwegman Lundberg & Woessner, P.A.

(57) ABSTRACT

Techniques for determining a state of health of an energy storage device that utilize a capacitor gain amplifier to provide an AC gain and block the DC voltage. An input capacitor can couple between an input excitation signal generator circuit and the amplifier's inverting input terminal, and a feedback capacitor can couple between the amplifier's inverting input terminal and the amplifier's output. A switch can be used to reset the feedback capacitor periodically to prevent the amplifier's output from becoming saturated from a leakage current at the inverting input terminal of the amplifier.

20 Claims, 13 Drawing Sheets

(56) References Cited

U.S. PATENT DOCUMENTS

| | | | |
|---|---|---|---|
| 7,619,390 | B2 | 11/2009 | Kim |
| 7,759,902 | B2 | 7/2010 | Gangsto et al. |
| 7,834,792 | B2 | 11/2010 | Sherry et al. |
| 8,452,557 | B2 | 5/2013 | Naumann et al. |
| 9,234,943 | B2 | 1/2016 | Fabregas et al. |
| 9,638,762 | B2 | 5/2017 | Scherr |
| 9,995,775 | B2 | 6/2018 | Dong et al. |
| 10,359,449 | B2 | 7/2019 | Callanan |
| 10,429,450 | B2 | 10/2019 | Lee et al. |
| 2008/0150516 | A1* | 6/2008 | Yonezawa ........ G01R 19/16542 324/123 R |
| 2009/0121908 | A1 | 5/2009 | Regier |
| 2010/0033240 | A1 | 2/2010 | Denison et al. |
| 2012/0084032 | A1* | 4/2012 | McHardy ............. G01R 31/385 702/63 |
| 2016/0109525 | A1 | 4/2016 | Chau et al. |
| 2016/0259010 | A1 | 9/2016 | Syouda |
| 2021/0141023 | A1* | 5/2021 | Gunji .................... H01M 10/48 |

FOREIGN PATENT DOCUMENTS

| | | |
|---|---|---|
| CN | 109212430 A | 1/2019 |
| CN | 110641317 A | 1/2020 |
| CN | 110837057 | 2/2020 |
| CN | 114690055 | 7/2022 |
| EP | 2535729 A1 | 12/2012 |
| JP | 2006220629 A | 8/2006 |
| JP | 2008175687 A | 7/2008 |
| JP | 4739710 B2 | 5/2011 |
| JP | 2017227518 A | 12/2017 |
| JP | 2019086474 A | 6/2019 |
| JP | 2020002936 A | 1/2020 |
| JP | 6739160 B2 | 7/2020 |
| WO | WO-2013037307 A1 | 3/2013 |
| WO | WO-2014208546 A1 | 12/2014 |
| WO | WO-2019081365 A1 | 5/2019 |
| WO | WO-2019245215 A1 | 12/2019 |
| WO | WO-2020111896 A1 | 6/2020 |

OTHER PUBLICATIONS

Astafev, EA, "Electrochemical Noise of a Li-Ion Battery: Measurement and Spectral Analysis", Journal of Solid State Electrochemistry, 23(4), (Feb. 2019), 12 pgs.

Gorbold, Jeremy R, et al., "Battery SOH Determination Circuit", U.S. Appl. No. 16/997,624, filed Aug. 19, 2020, 42 pgs.

Li, Dale, "Current Shunt and Voltage Measurement Reference Design for EV/HEV Automotive Battery Monitoring", Texas Instruments Inc., (Oct. 2015), 36 pgs.

Murnane, Martin, "A Closer Look at State of Charge (SOC) and State of Health (SOH) Estimation Techniques for Batteries", Analog Devices Technical Article, (2017), 8 pgs.

"European Application Serial No. 21214781.3, Extended European Search Report dated May 13, 2022", 5 pgs.

Liwei, Li, "Study and realization on the internal impedance of single cell on-line detector", Automation and Logistics, ICAL IEEE International Conference On, IEEE, Piscataway, NJ, USA, (2008), 2718-2721.

* cited by examiner

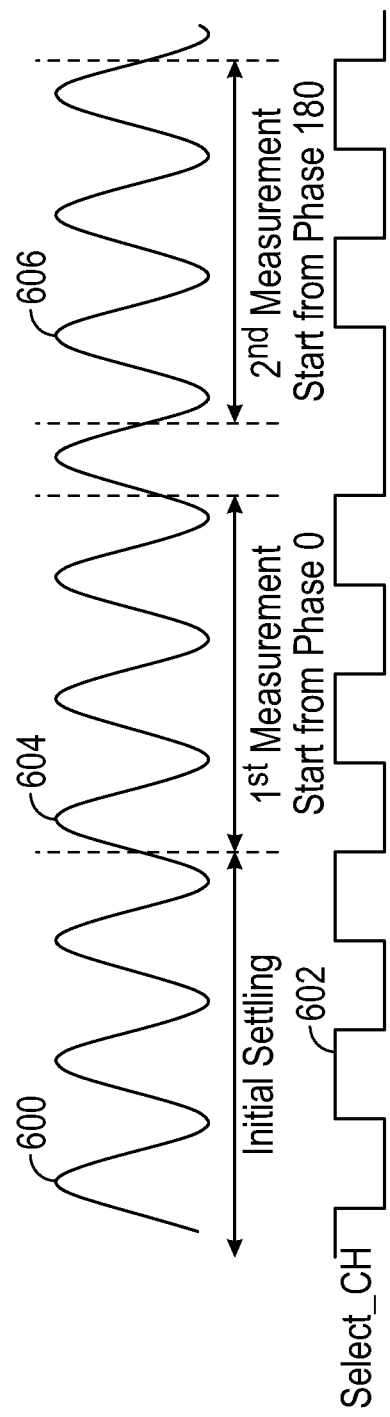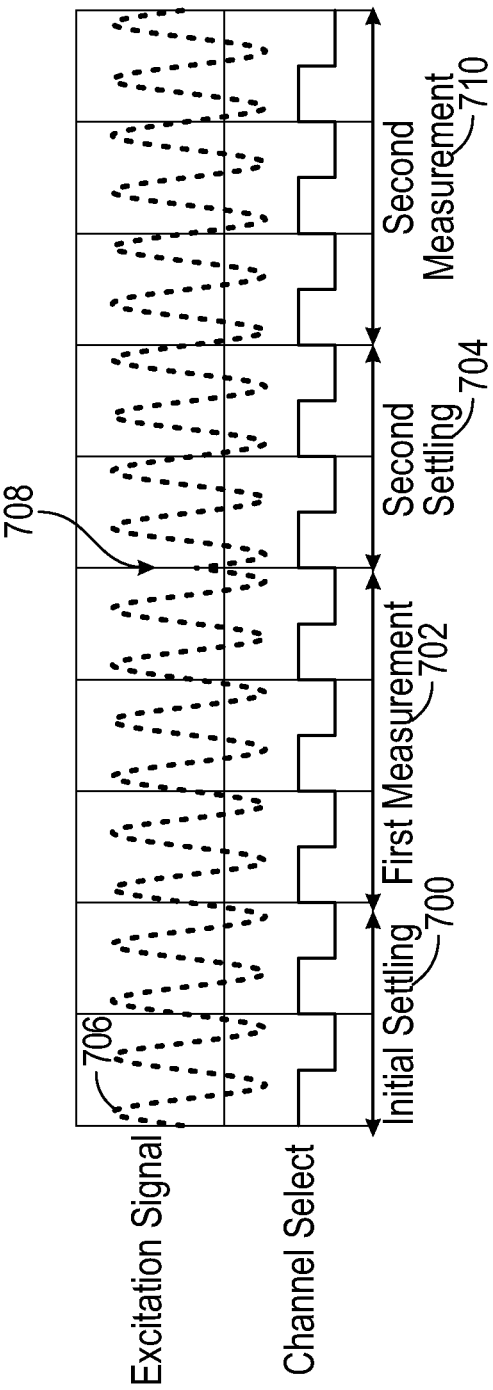
FIG. 6
FIG. 7

TECHNIQUES FOR DETERMINING ENERGY STORAGE DEVICE STATE OF HEALTH

CLAIM OF PRIORITY

This application claims the benefit of priority of U.S. Provisional Patent Application Ser. No. 63/131,047, titled "TECHNIQUES FOR DETERMINING BATTERY STATE OF HEALTH" to Damien McCartney et al., filed on Dec. 28, 2020, the entire contents of which being incorporated herein by reference.

FIELD OF THE DISCLOSURE

This document pertains generally, but not by way of limitation, to energy storage device monitoring techniques.

BACKGROUND

Individual battery cells can be connected in series to provide a battery stack having a desired output voltage. A large number of cells may be connected in series such that the total potential difference developed across the battery stack is on the order of 150-600 volts, for example.

In general, it can be desirable to monitor the terminal voltage, the impedance, the state of charge (SOC), and the state of health (SOH) of each individual cell in the battery stack. The terminal voltage is a direct measurement of the DC voltage at the cell terminals. Battery impedance can be directly measured by applying an AC excitation current and measuring the resultant small signal AC voltage at the cell terminals. By contrast, SOC and SOH are usually inferred from one or both of the direct measurements and sometimes also from the usage history of the cell. They are indirect measurements. Internal cell temperature can be directly measured but can be inferred or indirectly measured, such as from the impedance.

A low terminal voltage may indicate a discharged condition. In general, terminal voltages (DC) can be monitored regularly. The cell impedances (using AC voltage) can be measured as frequently (or perhaps less often). SOH can change less rapidly that SOC. If the internal cell temperature is being inferred from impedance, then it can be desirable to measure the terminal voltage more frequently.

SUMMARY OF THE DISCLOSURE

This disclosure describes various techniques for determining a state of health of an energy storage device, such as including one or more battery cells or fuel cells, that utilize a capacitor gain amplifier to provide an AC gain and block the DC voltage. An input capacitor can couple between an input excitation signal generator circuit and the amplifier's inverting input terminal, and a feedback capacitor can couple between the amplifier's inverting input terminal and the amplifier's output. A switch can be used to reset the feedback capacitor periodically to prevent the amplifier's output from becoming saturated from a leakage current at the inverting input terminal of the amplifier.

In some aspects, this disclosure is directed to a system for determining a state of health of an energy storage device, the system comprising: a signal generator circuit configured to generate and apply an excitation signal to at least one cell of the energy storage device; a first capacitive gain amplifier circuit coupled with the signal generator circuit and configured to generate a first output signal in response to the excitation signal, the first capacitive gain amplifier circuit including a first inverting input terminal; a control circuit configured to control operation of a first switch element coupled with the first inverting input terminal to control a DC bias voltage; and a back-end circuit configured to use the first output signal of the first capacitive gain amplifier circuit to determine a characteristic of the energy storage device that represents the state of health of the energy storage device.

In some aspects, this disclosure is directed to a system for determining a state of health of an energy storage device, the system comprising: a signal generator circuit configured to generate and apply an excitation signal to at least one cell of the energy storage device; a first channel including a first capacitive gain amplifier circuit, the first capacitive gain amplifier circuit coupled with the signal generator circuit and configured to generate a first output signal in response to the excitation signal, the first capacitive gain amplifier circuit including a first inverting input terminal; a second channel including a second capacitive gain amplifier circuit, the second capacitive gain amplifier circuit coupled with the signal generator circuit and configured to generate a second output signal in response to the excitation signal, the second capacitive gain amplifier circuit including a second inverting input terminal, a control circuit configured to control operation of a first switch element coupled with the first inverting input terminal to control a first DC bias voltage and a second switch element coupled with the second inverting input terminal to control a second DC bias voltage on the second inverting input terminal; and a back-end circuit configured to use the first output signal of the first capacitive gain amplifier circuit and the second output signal of the second capacitive gain amplifier circuit to determine a characteristic of the energy storage device that represents the state of health of the energy storage device.

In some aspects, this disclosure is directed to a method of determining a state of health of an energy storage device, the method including: generating and applying an excitation signal to at least one cell of the energy storage device; using a first capacitive gain amplifier circuit to generate a first output signal in response to the excitation signal, the first capacitive gain amplifier circuit including a first inverting input terminal; controlling operation of a first switch element coupled with the first inverting input terminal to control a first DC bias voltage; and determining, using the first output signal of the first capacitive gain amplifier circuit, a characteristic of the energy storage device that represents of the state of health of the energy storage device.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 6 is a diagram illustrating an example of a use of a channel selection signal that changes phase relative to an excitation signal to determine a characteristic of the energy storage device that represents of the state of health of the energy storage device.

FIG. 7 is a diagram illustrating an example of an excitation signal that changes phase to determine a characteristic of the energy storage device that represents of the state of health of the energy storage device.

DETAILED DESCRIPTION

It can be important to measure the state of charge (SOC) of battery cells in a battery stack, which is defined as the available capacity (in Ah) and expressed as a percentage of its rated capacity. The SOC parameter can be viewed as a thermodynamic quantity enabling one to assess the potential energy of a battery. The SOC parameter of a battery decreases over time as energy is drawn from the battery.

Additionally or alternatively, it can be desirable to estimate the state of health (SOH) of a battery, which represents a measure of the battery's ability to store and deliver electrical energy, compared with a new battery. A decline in the SOH of a battery can cause a battery to discharge faster. A battery's internal impedance is an example of a battery characteristic that corresponds well with its SOH and that can be measured periodically to monitor the battery.

In some examples, a low frequency AC excitation signal can be applied to the battery cells of the battery to measure its complex impedance. A test system can attempt to measure a small AC battery response signal on top of the large DC voltage of the battery.

In some implementations, the test system can use a passive RC high pass filter to block the DC voltage. Then, the low frequency AC excitation signal can be gained up and converted to a digital code by an analog-to-digital converter (ADC) circuit. Undesirably, the passive RC high pass filter can include a large, bulky, external DC blocking capacitor. When there are many battery cells, the area of the external DC blocking capacitors can be substantial. In addition, the high pass filter can cause an extra phase shift.

To solve one or more of the problems identified above, this disclosure describes various techniques for determining a state of health of a battery that utilize a capacitor gain amplifier to provide an AC gain and block the DC voltage. An input capacitor can couple between an input excitation signal generator circuit and the amplifier's inverting input terminal, and a feedback capacitor can couple between the amplifier's inverting input terminal and the amplifier's output. A switch can be used to reset the feedback capacitor periodically to prevent the amplifier's output from becoming saturated from a leakage current at the inverting input terminal of the amplifier.

The techniques of this disclosure can provide several advantages. For example, there is no need for an external DC blocking capacitor. Instead, the techniques can provide AC coupling inside a chip, resulting in an embedded solution. In addition, there is no phase shift when the techniques of this disclosure are used, due to the absence of the high pass RC filter.

Figure 1:
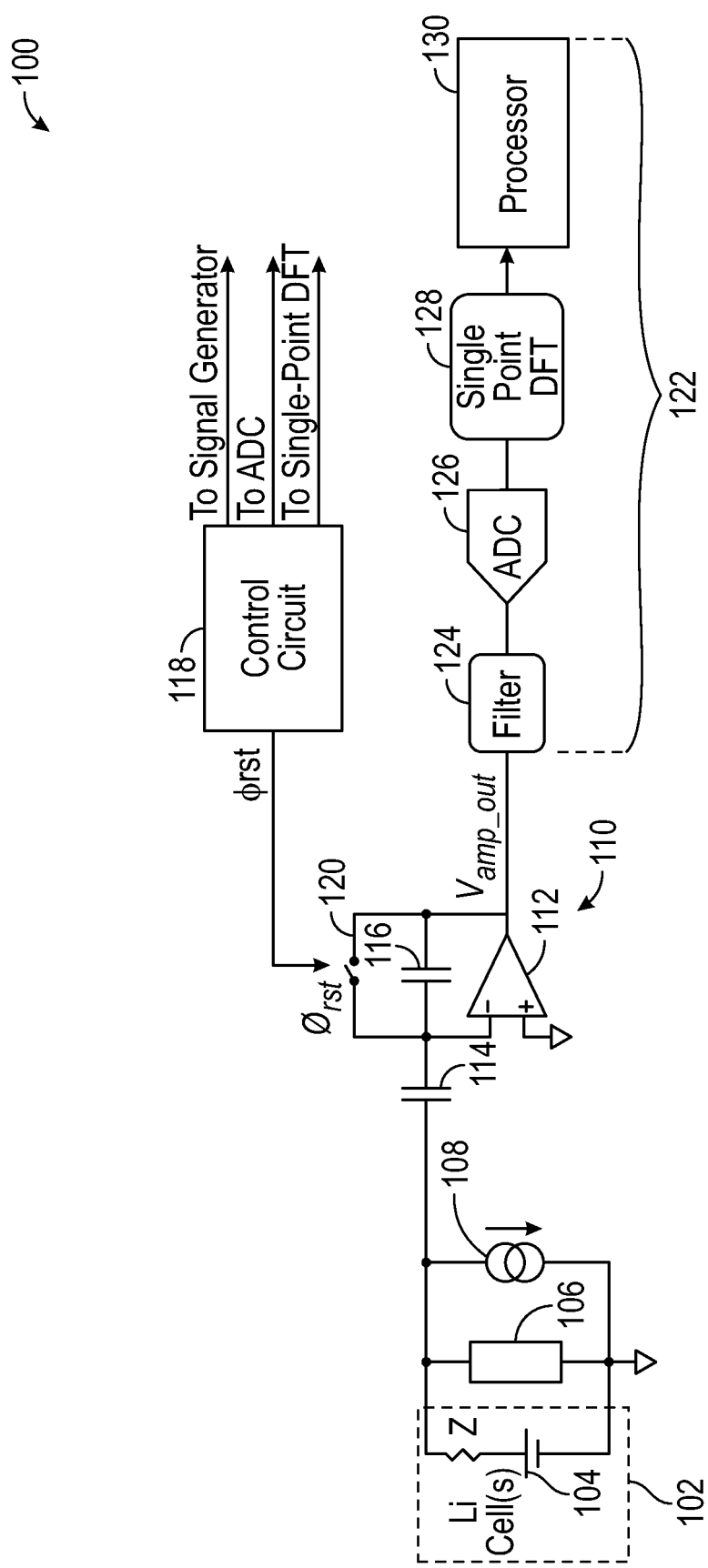
FIG. 1 is a schematic diagram of an example of a system for determining a state of health of an energy storage device.

FIG. 1 is a schematic diagram of an example of a system 100 for determining a state of health of an energy storage device. In some examples, the energy storage device can include one or more electrochemical fuel cells. In other examples, the energy storage device can be a battery 102 including one or more battery cells 104. Although this disclosure refers specifically to the energy storage device below as "battery 102" having "battery cells 104", it should be understood that the battery 102 can be an energy storage device generally that can include either one or more battery cells, one or more fuel cells, or one or more devices that can be used for electrolysis.

The battery 102 can include one or more battery cells 104, e.g., lithium ion (Li) cells, and have an internal impedance Z, such as 30 milliohms in a non-limiting example. The battery 102 can be coupled with a load 106. An excitation signal generator circuit 108 can generate and apply an excitation signal, such as an AC current, to the battery cell(s) 104 of the battery 102. In a non-limiting example, the excitation signal can be 100 mA and have a frequency between about 0.1 Hertz (Hz) and about 1 kHz.

The system 100 can include a capacitive gain amplifier circuit, shown generally at 110, coupled with the excitation signal generator circuit 108. In some examples, the excitation signal generator circuit 108 can generate a sinusoidal tone as a form of excitation. The capacitive gain amplifier circuit can include an amplifier circuit 112, an input capacitor 114 coupled between the excitation signal generator circuit 108 and an inverting input terminal of the amplifier circuit 112, and a feedback capacitor 116 coupled between the inverting input terminal of the amplifier circuit 112 and an output terminal of the amplifier circuit 112. The system 100 is a single-ended configuration and the non-inverting terminal of the amplifier circuit 112 is coupled to ground.

In contrast to using a resistive stage, the use of the resettable capacitive gain amplifier circuit 110 can advantageously block DC and allow only an AC signal to pass. In addition, the resettable capacitive gain amplifier circuit 110 can operate well at higher frequencies because there is less time for any DC leakage current to affect the output signal.

A control circuit 118 can output a control signal ϕrst to control operation of a switch element 120, such as a transistor, that can be coupled with the inverting input terminal of the amplifier circuit 112, which can reset the feedback capacitor 116 periodically to control a DC bias voltage, such as by preventing the amplifier's output from becoming saturated from a DC leakage current at the inverting input terminal of the amplifier circuit 112. A DC leakage current on the inverting input terminal of the amplifier circuit 112 can result in a ramp on top of the gained-up battery response signal, which can make it difficult to detect the sinusoidal tone of the excitation signal from the output signal of the amplifier circuit 112.

The input voltage applied to the capacitive gain amplifier circuit 110 is the AC response signal of the battery 102. Once the switch element 120 is opened, the output signal Vamp_out of the capacitive gain amplifier circuit 110, which is a gained-up version of the AC response signal of the battery 102, can follow the input voltage, with some amount of gain as determined by the ratio of the input capacitor 114 to the feedback capacitor 116.

The system 100 can further include a back-end circuit 122 to use the output signal Vamp_out of the capacitive gain amplifier circuit 110 to determine a characteristic of the battery that represents of the state of health of the battery. In some examples, the characteristic of the battery 102 can include an impedance of the battery, e.g., a complex impedance of the battery 102.

In the example shown in FIG. 1, the back-end circuit 122 can include an anti-aliasing filter 124, an ADC circuit 126, and a single-point Discrete Fourier Transform (DFT) filter 128. The single-point DFT filter 128 can process the output of the ADC circuit 126 to determine the magnitude and phase at the excitation frequency of the excitation signal from the excitation signal generator circuit 108 that is present in the output signal Vamp_out. The single-point DFT filter 128 can multiply the received signal by the excitation (and its quadrature component) over an integral number of cycles. The resulting in-phase and quadrature components can be combined to generate the phase and magnitude of the received signal. The detection of the presence of a single sinusoidal tone can also be referred to as synchronous detection or synchronous demodulation.

The back-end circuit 122 can further include a processor 130 that can receive the output of the single-point DFT filter 128. Using the known excitation signal generated by the excitation signal generator circuit 108 and the measured response signal Vamp_out of the capacitive gain amplifier circuit 110, the processor 130 can process the output signal of the first capacitive gain amplifier circuit to determine a characteristic of the battery that represents of the state of health of the battery 102, such as an impedance of the battery 102.

In some examples, it can be desirable to use different frequencies of excitation to determine a characteristic of the battery that represents the state of health of the battery 102, such as an impedance of the battery 102. For example, the control circuit 118 can control the excitation signal generator circuit 108 to output a current having a first frequency and the processor 130 can determine the battery's response to the first frequency. Similarly, the control circuit 118 can control the excitation signal generator circuit 108 to output currents having second, third, and fourth frequencies (or more), and the processor 130 can determine the battery's response to those frequencies. In this manner, a number of characteristics, such as impedances, of the battery 102 can be determined as a function of frequency.

The example of a system shown in FIG. 1 includes a single channel. In some implementations, it can be desirable to use two (or more) channels. For example, the use of two channels in a ping-ping operation can overcome DC current leakages at the amplifier circuit's virtual ground and thus support very low frequency implementations, such as at or below about 10 Hz, as shown and described below with respect to FIG. 2.

Figure 2:
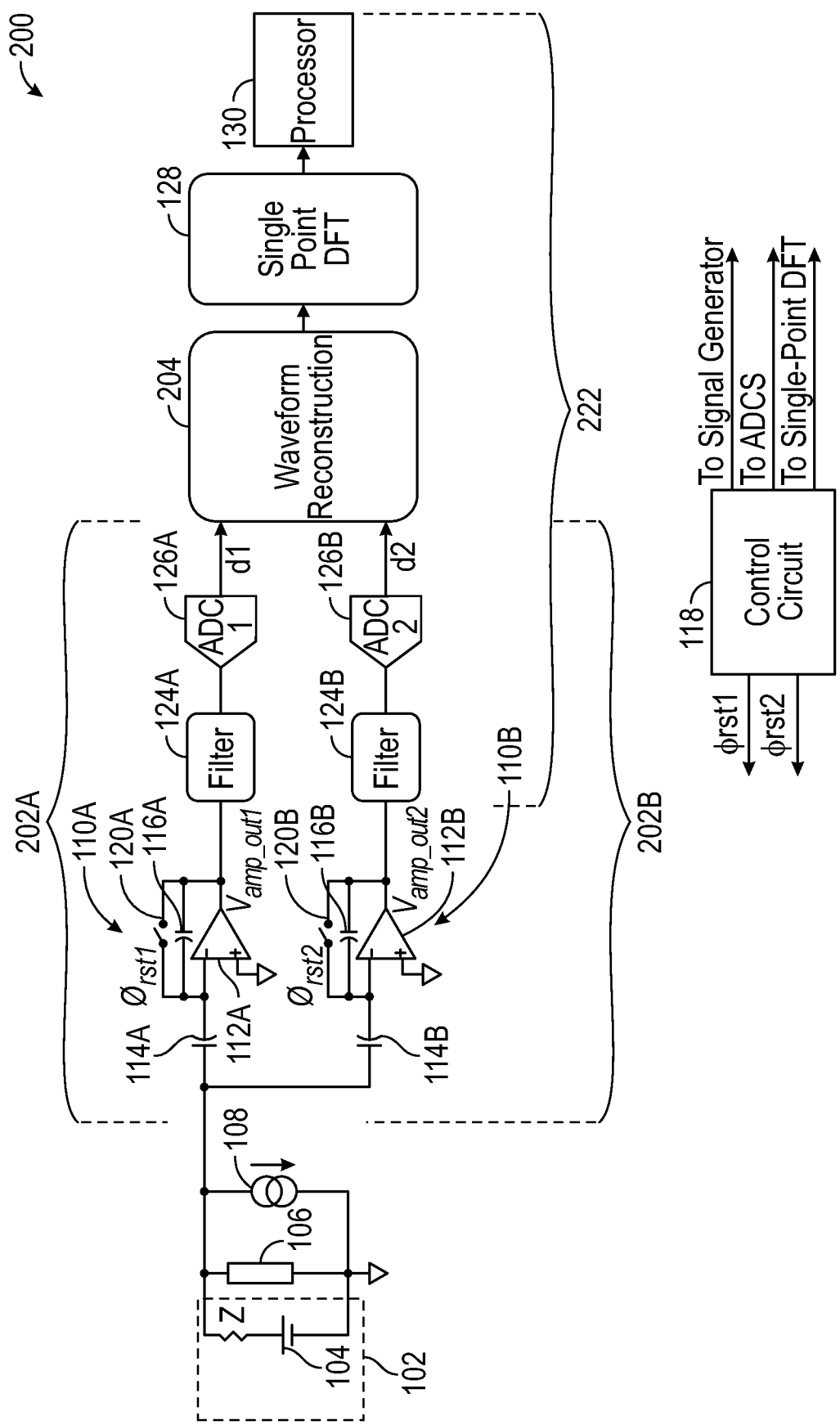
FIG. 2 is a schematic diagram of another example of a system for determining a state of health of an energy storage device.

FIG. 2 is a schematic diagram of another example of a system 200 for determining a state of health of a battery 102. The system 200 is a two-channel implementation. The system of FIG. 2 includes some components similar to those shown in FIG. 1, with like numerals used for similar components and different letter suffixes representing different instances of similar components.

As described above with respect to FIG. 1, the switch element 120 can reset the feedback capacitor 116 periodically to control a DC bias voltage. However, in some implementations, resetting the feedback capacitor 116 can negatively affect the AC battery response signal. To solve this problem, the present inventors have recognized that a second channel can be used to observe the AC battery response signal when the switch element of the first channel is reset, and vice versa, in a ping-pong operation. As described below, the derivative information of the AC battery response signal can be preserved by the two channels and can be extracted by digital post-processing using a back-end circuit.

The system 200 can include a first channel, shown generally at 202A, which can include a first capacitive gain amplifier circuit, shown generally at 110A, coupled with the excitation signal generator circuit 108. The first capacitive gain amplifier circuit can include an amplifier circuit 112A, an input capacitor 114A coupled between the excitation signal generator circuit 108 and an inverting input terminal of the amplifier circuit 112A, and a feedback capacitor 116A coupled between the inverting input terminal of the amplifier circuit 112A and an output terminal of the amplifier circuit 112A. The first channel 202A can generate a first output signal d1.

The system 200 can further include a second channel, shown generally at 202B, which can include a second capacitive gain amplifier circuit, shown generally at 110B, coupled with the signal generator circuit 108. The second capacitive gain amplifier circuit can include an amplifier circuit 112B, an input capacitor 114B coupled between the excitation signal generator circuit 108 and an inverting input terminal of the amplifier circuit 112B, and a feedback capacitor 116B coupled between the inverting input terminal of the amplifier circuit 112B and an output terminal of the amplifier circuit 112B. The second channel 202B can generate a second output signal d2.

During a ping operation that operates the first channel 202A, the control circuit 118 can output a signal ϕrst1 to control operation of a switch element 120A that can be coupled with the inverting input terminal of the amplifier circuit 112A, which can reset the feedback capacitor 116A in the first channel 202A periodically to control a DC bias voltage at the inverting input terminal of the amplifier circuit 112A. Similarly, in a pong operation that operates the second channel 202B, the control circuit 118 can output a signal ϕrst2 to control operation of a switch element 120B that can be coupled with the inverting input terminal of the amplifier circuit 112B, which can reset the feedback capacitor 116B in the second channel 202B periodically to control a DC bias voltage at the inverting input terminal of the amplifier circuit 112B.

In some examples, the excitation signal is an AC signal having a first frequency, where the control circuit 118 is configured to control the operation of the first switch element 120A and the second switch element 120B at a second frequency, and where the second frequency is greater than the first frequency or where the second frequency is less than the first frequency. In some examples, the first frequency and the second frequency can be equal.

In some examples, a measurement can be one frequency data point or one measurement of some number of cycles of the excitation. Subsequently, further measurements can be taken, each of at another excitation frequency, for example. For example, the change in frequency can be a staircase of changing frequencies.

The system 200 can further include a back-end circuit 222 to use the output signals of the capacitive gain amplifier circuits 110A, 110B to determine a characteristic of the battery that represents of the state of health of the battery. In some examples, the characteristic of the battery 102 can include an impedance of the battery, e.g., a complex impedance of the battery 102.

In the example shown in FIG. 2, the back-end circuit 222 can include components of both the first channel 202A and the second channel 202B, namely anti-aliasing filters 124A, 124B and ADCs 126A, 126B, as well as components shared by both the first channel 202A and the second channel 202B, namely a waveform reconstruction circuit 204, a single-point DFT filter 128, and a processor 130.

The ADCs 126A, 126B output digital signals d1, d2, which are periodically offset or periodically reset versions of the representations of the AC battery response signal of the battery 102. The waveform reconstruction circuit 204 can receive the outputs d1, d2 of ADCs 126A, 126B, respectively, and reconstruct a digital representation of the AC battery response signal, as described in more detail below with respect to FIG. 3. The waveform reconstruction circuit 204 can monitor the rate of change in the two channels 202A, 202B and use the rate of change information to reconstruct the AC response signal of the battery 102.

The digital representation of the reconstructed AC battery response signal, as determined by the waveform reconstruction circuit 204, can be applied to the single-point DFT filter 128. The single-point DFT filter 128 can detect the presence of a single sinusoidal tone in the output of the digital representation of the reconstructed AC battery response signal to determine whether the frequency of the excitation signal from the excitation signal generator circuit 108 is present and quantify its phase and magnitude.

The back-end circuit can further include a processor 130 that can receive the output of the single-point DFT filter 128. In some examples, the waveform reconstruction circuit 204 and the single-point DFT filter 128 are part of the processor 130. In some examples, the processor 130 is a field-programmable gate array (FPGA). Thus, the processor 130 can receive a first representation of the first output signal, such as the first representation d1, and a second representation of the second output signal, such as the second representation d2. Using the first representation and the second representation, the processor 130 can determine a representation of a battery response signal that is responsive to the excitation signal, such as a derivative as described below with respect to FIG. 3, and determine a characteristic of the battery, such as an impedance of the battery 102, using the representation of the battery response signal and the excitation signal.

Using the known excitation signal generated by the excitation signal generator circuit 108 and the measured battery response signals Vamp_out1 of the capacitive gain amplifier circuit 110A and Vamp_out2 of the capacitive gain amplifier circuit 110B, the processor 130 can process the output signals of the first capacitive gain amplifier circuit and the second capacitive gain amplifier circuit to determine a characteristic of the battery that represents of the state of health of the battery 102, such as an impedance of the battery 102.

In some examples, it can be desirable to use different frequencies of excitation to determine a characteristic of the battery that represents of the state of health of the battery 102, such as an impedance of the battery 102. For example, the control circuit 118 can control the excitation signal generator circuit 108 to output a current having a first frequency and the processor 130 can determine the battery's response to the first frequency. Similarly, the control circuit 118 can control the excitation signal generator circuit 108 to output currents having second, third, and fourth frequencies, and the processor 130 can determine the battery's response to those frequencies. In this manner, a number of characteristics, such as impedances, of the battery can be determined as a function of frequency.

With a two-channel implementation, such as the system 200 of FIG. 2, in some examples, the control circuit 118 can use a fixed ping-pong rate, which is the channel select rate, and vary the frequency of the excitation signal. In other examples, the control circuit 118 can use a ping-pong that varies and also vary the frequency of the excitation signal.

Figure 3:
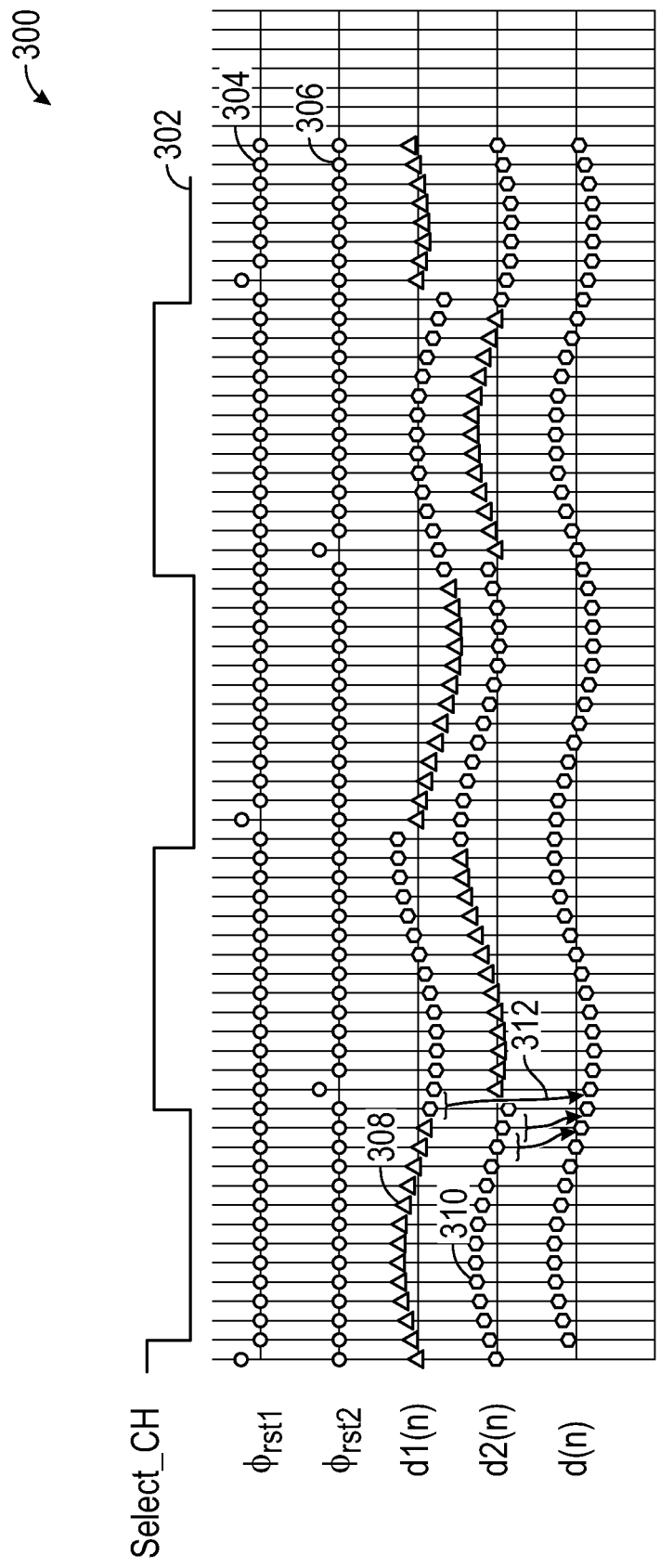
FIG. 3 is a diagram illustrating an example of a timing diagram showing a relationship between a timing of the switches and channels and the corresponding output signals.

FIG. 3 is a diagram illustrating an example of a timing diagram 300 showing a relationship between a timing of the switches and channels and the corresponding output signals d1, d2 of the ADCs 126A, 126B. FIG. 3 depicts the timing of the channel select signal 302 (select_ch), which is the rate at which the control circuit 118 of FIG. 2, for example, ping pongs between the first and second channels 202A, 202B. FIG. 3 also depicts the timing of the two switch signals φrst1 304, φrst2 306 that control the switch elements 120A, 120B of FIG. 2. FIG. 3 also depicts the output signals d1(n) 308, d2(n) 310 of the ADCs 126A, 126B, respectively. The output signals d1(n), d2(n) are periodically offset or periodically reset versions of the AC battery response signal of the battery presented at the inputs of the first capacitive gain amplifier circuit 110A, and the second capacitive gain amplifier circuit 1101B, respectively.

Each of the output signals d1(n), d2(n) are depicted with dots. The difference between adjacent dots can approach the derivative of the AC battery response signal when high ADC sampling rates compared to the excitation frequency are used. Some dots are not used by the waveform reconstruction circuit 204 of FIG. 2, due to settling from a corresponding reset signal, such as signals φrst1, φrst2. However, because the control circuit 118 of FIG. 2 is ping-ponging between the first and second channels 202A, 202B, derivative information can be obtained at all times. For example, even though the information in signal d2(n) cannot be used at the time when signal φrst2 goes high, information in signal d1(n) at that same time is available. This is shown graphically at 312. Similarly, even though the information in signal d1(n) cannot be used at the time when signal φrst1 goes high, information in signal d2(n) at that same time is available.

The waveform reconstruction circuit 204 of FIG. 2 can reconstruct the waveform of the AC battery response signal of the battery from the difference information. For example, the waveform reconstruction circuit 204 of FIG. 2 can include an integrator circuit, such as the integrator circuit 204 of FIG. 4, to continuously accumulate differences from one or other of the channels preceding it. In this manner, the waveform reconstruction circuit 204 of FIG. 2 integrates a difference signal to reconstruct the AC battery response signal.

Figure 4:
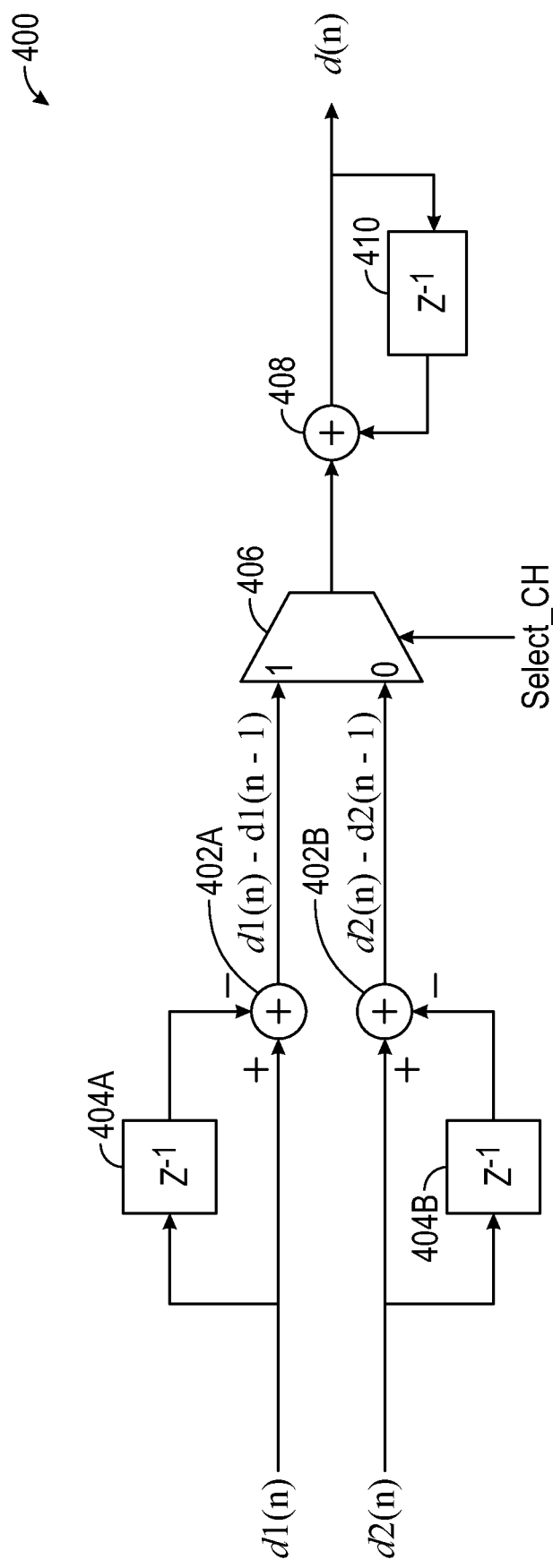
FIG. 4 is an example of a waveform reconstruction circuit that can be used to reconstruct the AC battery response signal of an energy storage device.

FIG. 4 is an example of a waveform reconstruction circuit that can be used to reconstruct the AC battery response signal of a battery. The waveform reconstruction circuit 400 can be an example of the waveform reconstruction circuit 204 of FIG. 2.

The waveform reconstruction circuit 400 can receive a first digitized output signal d1(n), such as output by the ADC 126A of the first channel 202A of FIG. 2, and a second digitized output signal d2(n), such as output by the ADC 126B of the second channel 202B of FIG. 2. The first digitized output signal d1(n) is added to a summer block 402A and, using a delay element 404A, a delayed version d1(n−1) of the first digitized output signal is subtracted from the summer block 402A, resulting in d1(n)−d1(n−1), which is the difference between two successive points in the output signal d1. The first digitized output signal difference is applied to a first input of a multiplexer 406. Thus, the first input of the multiplexer 406 can receive a first representation of the first output signal d1.

Similarly, the second digitized output signal d2(n) is added to a summer block 402B and, using a delay element 404B, a delayed version d2(n−1) of the second digitized output signal is subtracted from the summer block 402B, resulting in d2(n)−d2(n−1), which is the difference between two successive points in the output signal d2. The second digitized output signal difference is applied to a second input of the multiplexer 406. Thus, the second input of the multiplexer 406 can receive a second representation of the second output signal d2.

A control circuit, such as the control circuit 118 of FIG. 2, can output a channel select signal (select_ch) to the multiplexer 406 to select one of the two inputs of the multiplexer. The output of the multiplexer 406 can be applied to a summer block 408. A second delay element 410 can be coupled with the summer block 408 and the output of the second delay element 410 can be fed back to the summer block 408, thereby forming an integrator and generating an output d(n), which is a reconstruction of a representation of the AC battery response signal of the battery from signals d1, d2.

Figure 5:
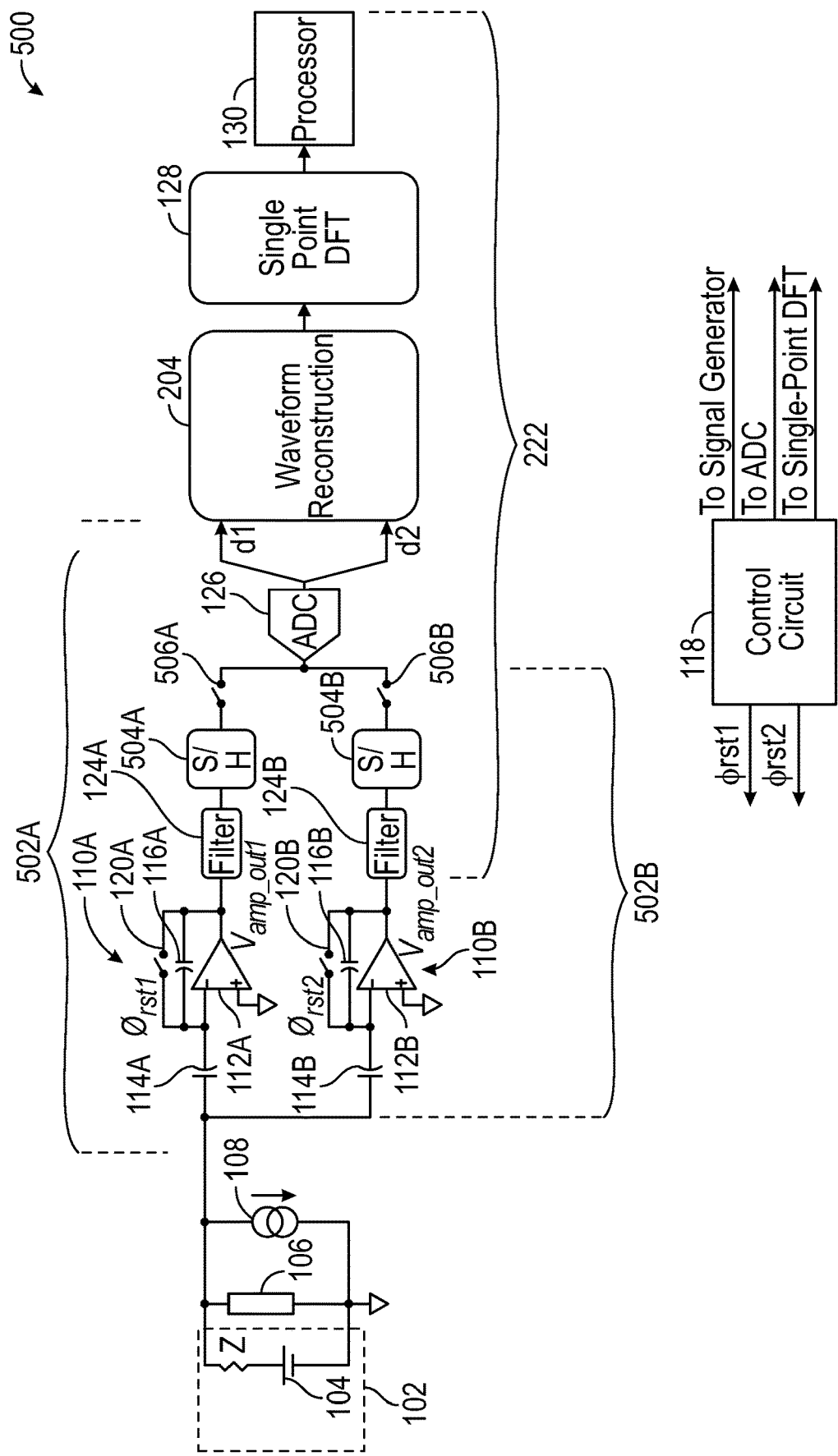
FIG. 5 is a schematic diagram of another example of a system for determining a state of health of an energy storage device.

FIG. 5 is a schematic diagram of another example of a system 500 for determining a state of health of a battery 102. The system 500 is another two-channel, ping-pong implementation. Unlike the system 200 of FIG. 2, the system 500 includes a shared ADC. The system 500 of FIG. 5 includes some components similar to those shown in FIGS. 1 and 3, with like numerals used for similar components and different letter suffixes representing different instances of similar components.

In contrast to the two-channel system 200 of FIG. 2, the two-channel system 500 includes an ADC 126 that is shared by the two channels 502A, 502B. To share the ADC 126, each channel 502A, 502B can include a corresponding sample and hold (S/H) circuit 504A, 504B. The S/H circuits 504A, 504B can hold the samples of the corresponding representations of the AC response signal of the battery 102 until the samples are required by the ADC 126. The switch elements 506A, 506B (after the corresponding S/H circuits 504A, 504B) can each receive a channel select signal from the control circuit 118.

In some examples, it can be desirable to disable one of the two channels, such as in either the system 200 of FIG. 2 or the system 500 of FIG. 5. For example, when the frequency of the excitation signal is sufficiently high, such as above about 10 Hz, the DC leakage current issues may no longer be a concern. As such, performing a ping-pong operation between the two channels may not be necessary. Using a system capable of a ping-pong operation, such as the system 200 of FIG. 2 or the system 500 of FIG. 5, the control circuit can disable one of the two channels based on the frequency of the AC excitation signal, such as by keeping the channel select signal at constant logic level, thereby only enabling one of the two channels and disabling the other channel.

FIG. 6 is a diagram illustrating an example of a use of a channel selection signal that changes phase relative to an excitation signal to determine a characteristic of the battery that represents of the state of health of the battery. An excitation signal generator circuit, such as the excitation signal generator circuit 108 of FIG. 2, can generate the excitation signal 600, which is shown with a channel select signal 602 (select_ch). After a period of initial settling, a first measurement 604 can start at phase 0 degrees. After some amount of time, the phase of the channel select signal 602 can be changed between the first measurement 604 and a second measurement 606 while the phase of the excitation signal 600 remains the unchanged. In other words, the phase of the second measurement 606 and be opposite the phase of the first measurement 604.

Any DC leakage current can result in an upward slope of an AC response signal of the battery. Here, by performing two measurements of opposite phases, subtracting the results, and then performing an average, the DC leakage current error can be removed. In some examples, the SNR measurement can be improved by 3 dB as a result.

FIG. 7 is a diagram illustrating an example of a use of an excitation signal that changes phase to determine a characteristic of the battery that represents of the state of health of the battery. In FIG. 7, after an initial settling time 700, a first measurement 702 can be determined by a processor, such as the processor 130 of FIG. 1. After the first measurement 702 and before a second setting time 704, an excitation signal generator circuit, such as the excitation signal generator circuit 108 of FIG. 1, can change the phase of the excitation signal 706, as shown at 708, such that the excitation signal 706 is 180 degrees out of phase with its previous phase. Following the second settling time 704, a second measurement 710 can be determined by the processor. The data corresponding to each measurement can be determined after that measurement's corresponding initial settling.

In some examples, a gain between ping and pong can cause aliasing from the ping-pong frequency (the channel select frequency). As such, it can be desirable to perform a gain calibration to reduce this type of aliasing. For example, the control circuit can cause the excitation signal generator circuit to produce a square waveform at half of the ping-pong frequency. Then, the processor can determine the amplitude of the square waveform in each channel to derive the gain mismatch. Then, the processor can use this gain mismatch information to apply a gain correction to the data.

Filter bandwidth mismatch can cause a similar problem. Filter bandwidth mismatch can be solved by oversampling and applying well-controlled digital filtering after the ADCs and before a signal reconstruction.

Figure 8:
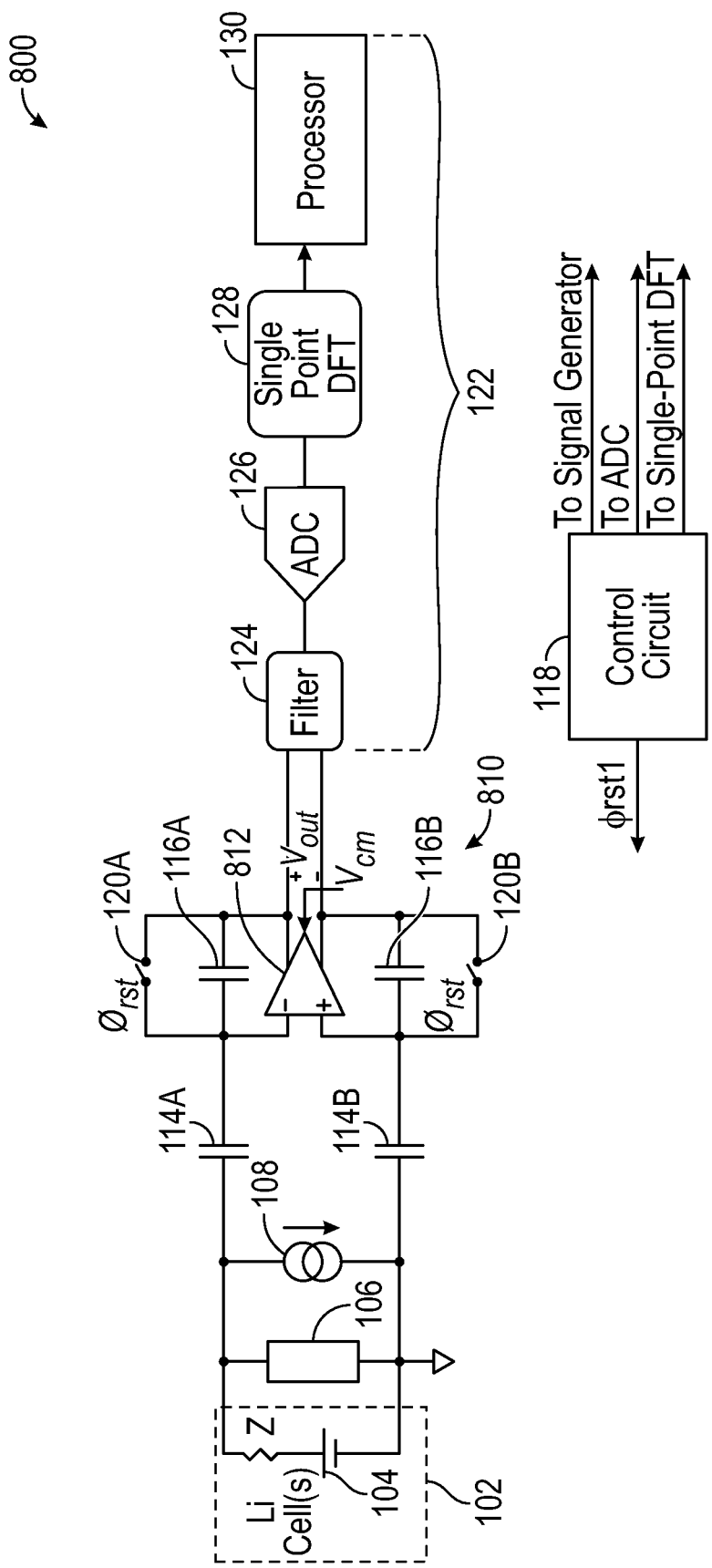
FIG. 8 is a schematic diagram of another example of a system for determining a state of health of an energy storage device.

Although the systems described above are single-ended systems, the techniques of this disclosure are not limited to single-ended systems. As shown in FIG. 8, the techniques are also applicable to differential systems.

FIG. 8 is a schematic diagram of another example of a system 800 for determining a state of health of a battery 102. The system 800 is a differential version of the single-ended system 100 of FIG. 1. The capacitive gain amplifier circuit 810 includes an amplifier circuit 812 having differential output terminals to produce output voltage Vout. The amplifier circuit 812 can also include a common mode input terminal to receive common mode voltage Vcm.

The inverting input of the differential system 800 is coupled to components in a manner similar to the single-ended system 100 of FIG. 1 and, for conciseness, will not be described again. Rather than coupling the non-inverting input to ground, such as in the single-ended system 100 of FIG. 1, the non-inverting input of the differential system 800 can be coupled like the inverting input to a capacitive gain amplifier circuit. The capacitive gain amplifier circuit 810 also includes an input capacitor 114B coupled between the excitation signal generator circuit 108 and a non-inverting input terminal of the amplifier circuit 812, and a feedback capacitor 116B coupled between the non-inverting input terminal of the amplifier circuit 812 and an output terminal of the amplifier circuit 812. A switch element 120B can be coupled with the non-inverting input terminal of the amplifier circuit 812, which can reset the feedback capacitor 116B periodically to control a DC bias voltage at the non-inverting input terminal of the amplifier circuit 812.

Although the two channel implementations shown in FIGS. 2 and 5 are depicted in single-ended configurations, in some examples, each channel of the systems 200, 500 of FIGS. 2 and 5 can be a differential configuration, like in FIG. 8.

Figure 9:
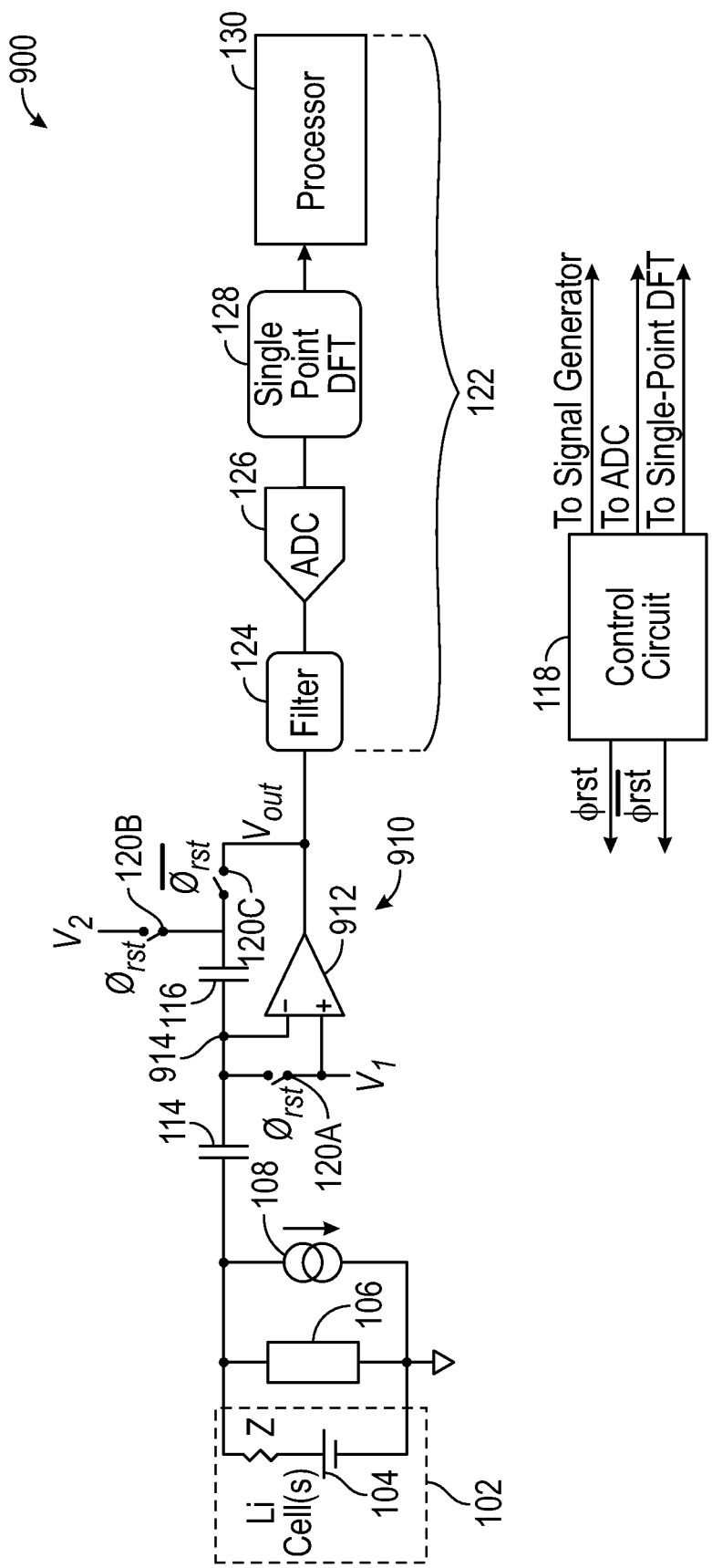
FIG. 9 is a schematic diagram of another example of a system for determining a state of health of an energy storage device.

FIG. 9 is a schematic diagram of another example of a system 900 for determining a state of health of a battery 102. The system 900 is a single-ended configuration that uses a capacitive gain amplifier circuit 910, with another example of reset circuitry that can be used to reset the feedback capacitor 116 periodically to prevent the output of the amplifier circuit 912 from becoming saturated from a leakage current at the negative input of the amplifier. The system 900 can include three switch elements 120A-120C that are controlled by controls signals ϕrst and ϕrst_bar. The control circuit 118 can output control signal ϕrst to open (or close) the switch elements 120A, 120B while the control circuit 118 outputs complementary control signal ϕrst_bar to close (or open) the switch element 120C.

Closing the switch element 120A using control signal ϕrst couples the summing node 914, which is the node between the input capacitor 114, the feedback capacitor 116, and the inverting terminal of the amplifier circuit 912, to a first voltage V1. Closing the switch element 120B using control signal ϕrst, while switch element 120C is open, couples a terminal of the feedback capacitor 116 to a second voltage V2. The switch element configuration shown in FIG. 9 can reset the inputs of the amplifier circuit 912 to a different voltage level than the output to accommodate the operating range of the amplifier circuit 912.

Figure 10:
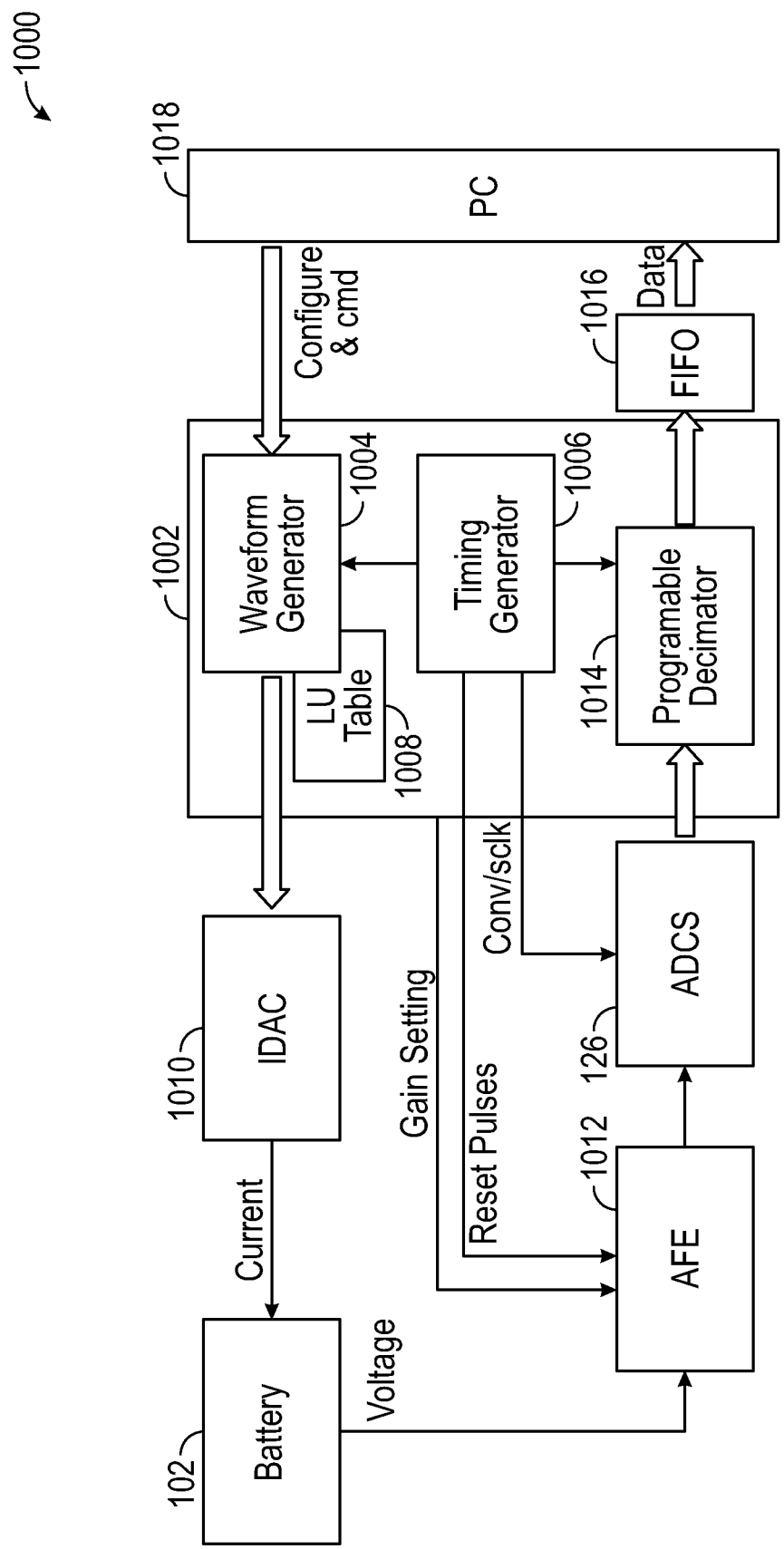
FIG. 10 is a block diagram of an example of a system that can implement various techniques of this disclosure.

FIG. 10 is a block diagram of an example of a system 1000 that can implement various techniques of this disclosure to determine a state of health of a battery 102. The system 1000 can be used to implement the systems 100, 200, 500, 800, or 900 described above.

The system 1000 can include a processor 1002, such as an FPGA, that can implement various functions including a waveform generator 1004 and a timing generator 1006. The waveform generator 1004 can use a lookup table 1008 (or some other data structure stored in memory) and the timing generator 1006 to generate signals applied to a current mode digital-to-analog converter (IDAC) 1010, thereby forming an example of an excitation signal generator circuit.

The timing generator can also generate and apply signals, such as gain setting signals and reset pulses, to a capacitive gain amplifier circuit, represented by analog front end (AFE) circuit 1012. The timing generator can also generate and apply signals (e.g., convert start, sdata, sclk) to the ADC 126 to control conversions. The timing generator can also generate and apply a signal to a programmable decimator 1014, which can reduce quantization noise. The output of the programmable decimator 1014 can then be applied to a FIFO register 1016, which can output data to a computer 1018.

Although many of the systems above were shown with respect to a single energy storage cell, e.g., battery cell or fuel cell, the techniques of this disclosure are not limited to use with a single energy storage cell, such as a battery cell or fuel cell. Rather, the techniques can be used with a stack of energy storage cells, e.g., a stack of battery cells or a stack of fuel cells, such as shown in FIGS. 11-14.

Figure 11:
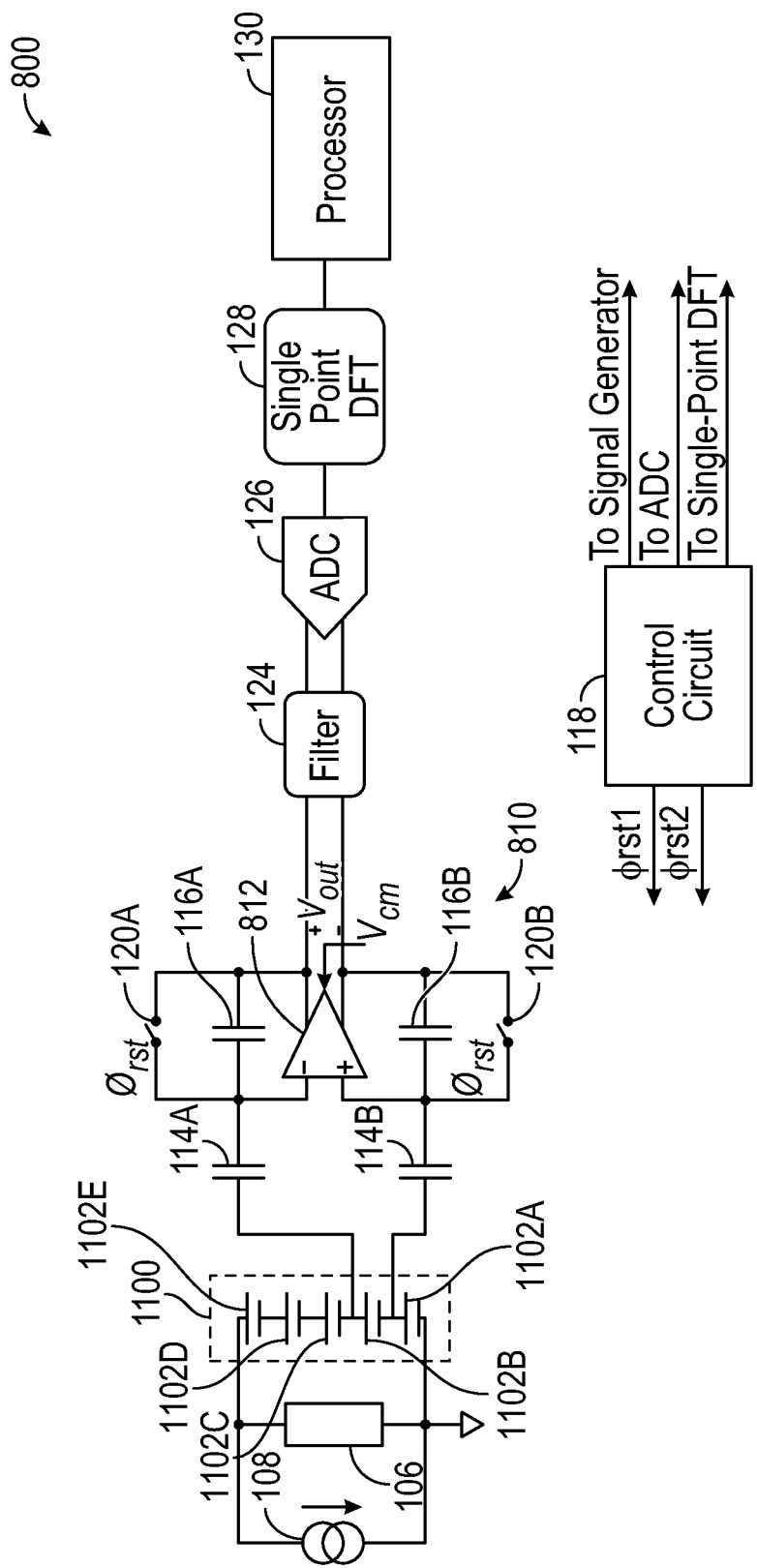
FIG. 11 is a schematic diagram of another example of a system for determining a state of health of one or more cells of a stack of energy storage cells.

FIG. 11 is a schematic diagram of another example of a system for determining a state of health of one or more cells of a stack of energy storage cells. An energy storage device 1100 can include a stack of two or more energy storage cells, shown as cells 1102A-1102E in FIG. 11, coupled in series. The energy storage device 1100 can be coupled with a load 106.

An excitation signal generator circuit 108 can generate and apply an excitation signal, such as an AC current, to the energy storage device 1100. In a non-limiting example, the excitation signal can be 100 mA and have a frequency between about 0.1 Hertz (Hz) and about 1 kHz. In the example shown in FIG. 11, all of the cells 1102A-1102E of the energy storage device 1100 see the same current injected by the excitation signal generator circuit 108, which is common to all the cells 1102A-1102E.

The health of individual cells of the energy storage device 1100 can be monitored using a system 800, like the differential system 800 described above with respect to FIG. 8. Other systems described above can also be used. By monitoring the voltage across an individual cell, e.g., cell 1102B, of the energy storage device 1100 for a given current from the excitation signal generator circuit 108, the system 800 can measure the impedance of the individual cell.

In some examples, there can be a system 800 associated with individual ones of the cells 1102A-1102E. For example, for an energy storage device 1100 with cells 1102A-1102E, each cell can be associated with a corresponding system 800. In other examples, a multiplexer can couple a single system 800 to a plurality of cells 1102A-1102E.

Figure 12:
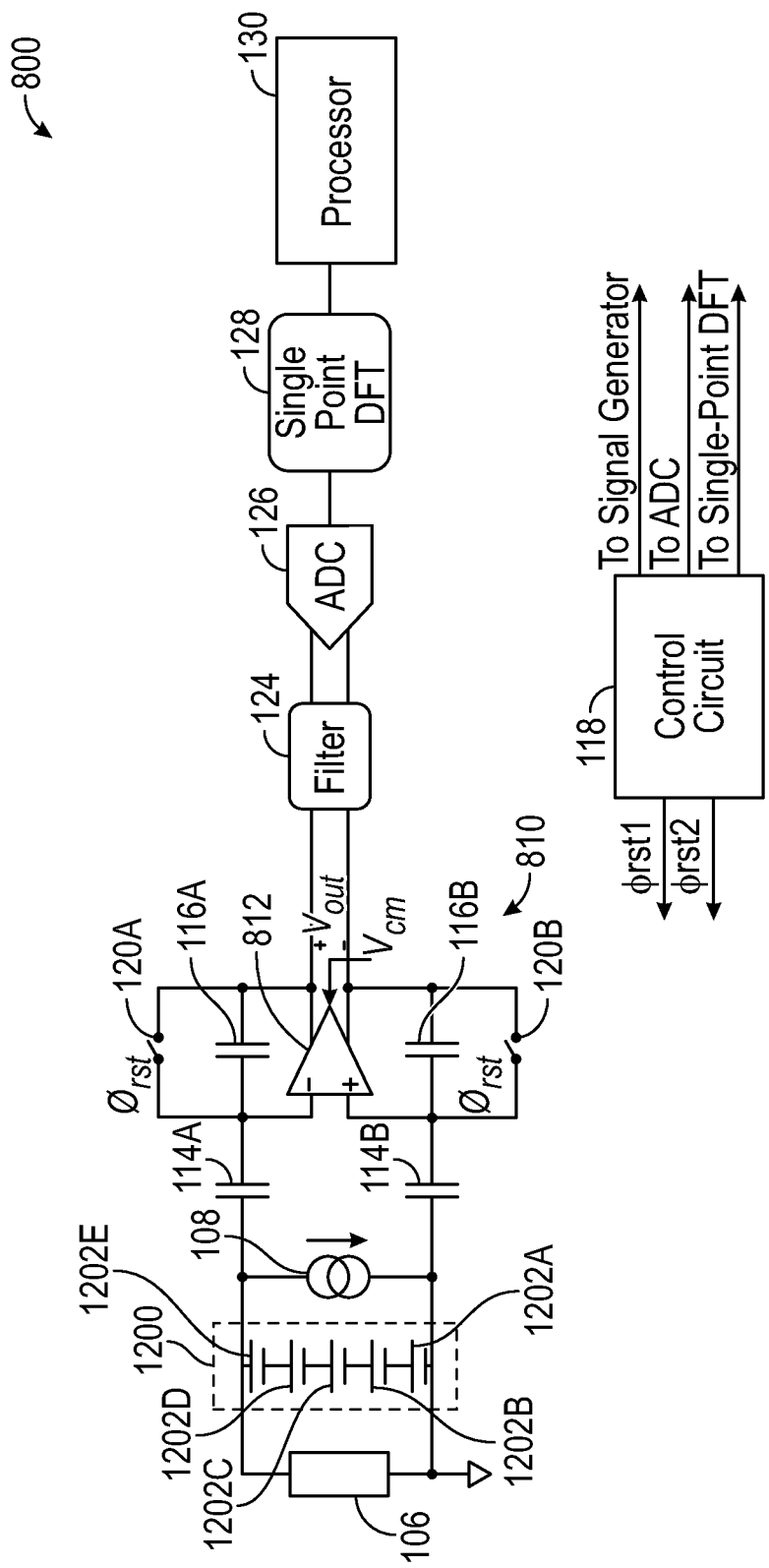
FIG. 12 is a schematic diagram of another example of a system for determining a state of health of one or more cells of a stack of energy storage cells.

FIG. 12 is a schematic diagram of another example of a system for determining a state of health of one or more cells of a stack of energy storage cells. An energy storage device 1200 can include a stack of two or more energy storage cells, shown as cells 1202A-1202E in FIG. 12, coupled in series. The energy storage device 1200 can be coupled with a load 106.

An excitation signal generator circuit 108 can generate and apply an excitation signal, such as an AC current, to the energy storage device 1200. In a non-limiting example, the excitation signal can be 100 mA and have a frequency between about 0.1 Hertz (Hz) and about 1 kHz. In the example shown in FIG. 12, all of the cells 1202A-1202E of the energy storage device 1200 see the same current injected by the excitation signal generator circuit 108, which is common to all the cells 1202A-1202E.

The health of the entire stack of energy storage cells of the energy storage device 1200 can be monitored using a system 800, like the differential system 800 described above with respect to FIG. 8. Other systems described above can also be used. By monitoring the voltage across all of the cells 1202A-1202E of the energy storage device 1100 for a given current from the excitation signal generator circuit 108, the system 800 can measure the impedance of the entire stack of cells.

Figure 13:
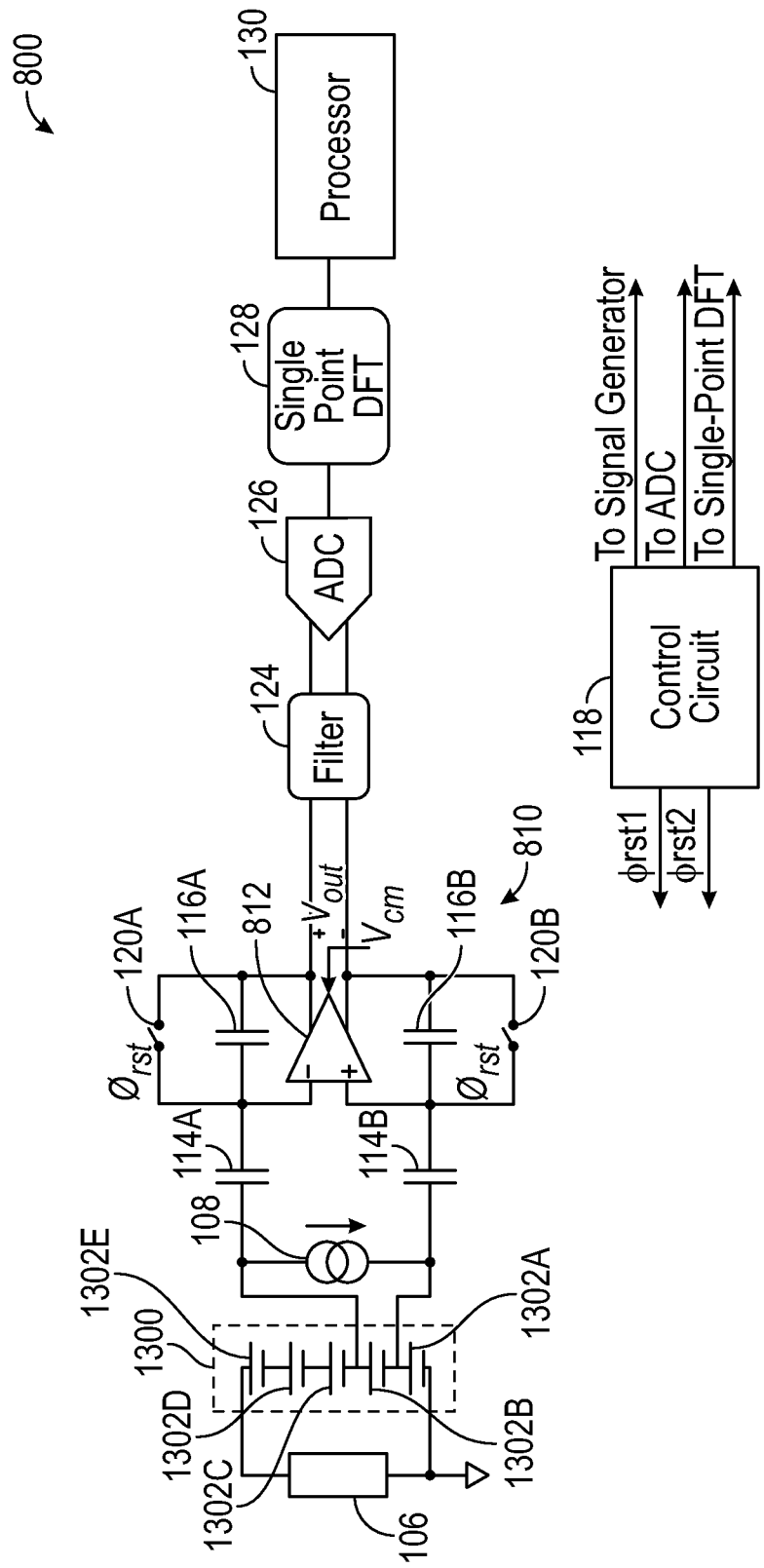
FIG. 13 is a schematic diagram of another example of a system for determining a state of health of one or more cells of a stack of energy storage cells.

FIG. 13 is a schematic diagram of another example of a system for determining a state of health of one or more cells of a stack of energy storage cells. An energy storage device 1300 can include a stack of two or more energy storage cells, shown as cells 1302A-1302E in FIG. 13, coupled in series. The energy storage device 1300 can be coupled with a load 106.

An excitation signal generator circuit 108 can generate and apply an excitation signal, such as an AC current, to the energy storage device 1300. In a non-limiting example, the excitation signal can be 100 mA and have a frequency between about 0.1 Hertz (Hz) and about 1 kHz. Unlike the common current excitation used in FIGS. 11 and 12, in the example shown in FIG. 13, the excitation signal generator circuit 108 can apply an excitation signal to individual ones of the cells 1302A-1302E of the energy storage device 1300.

The health of individual cells of the energy storage device 1300 can be monitored using a system 800, like the differential system 800 described above with respect to FIG. 8. Other systems described above can also be used. By monitoring the voltage across an individual cell, e.g., cell 1302B, of the energy storage device 1300 for a given current from the excitation signal generator circuit 108, the system 800 can measure the impedance of the individual cell.

In some examples, there can be a system 800 associated with individual ones of the cells 1302A-1302E. For example, for an energy storage device 1300 with cells 1302A-1302E, each cell can be associated with a corresponding system 800. In other examples, a multiplexer can couple a single system 800 to a plurality of cells 1302A-1302E.

Figure 14:
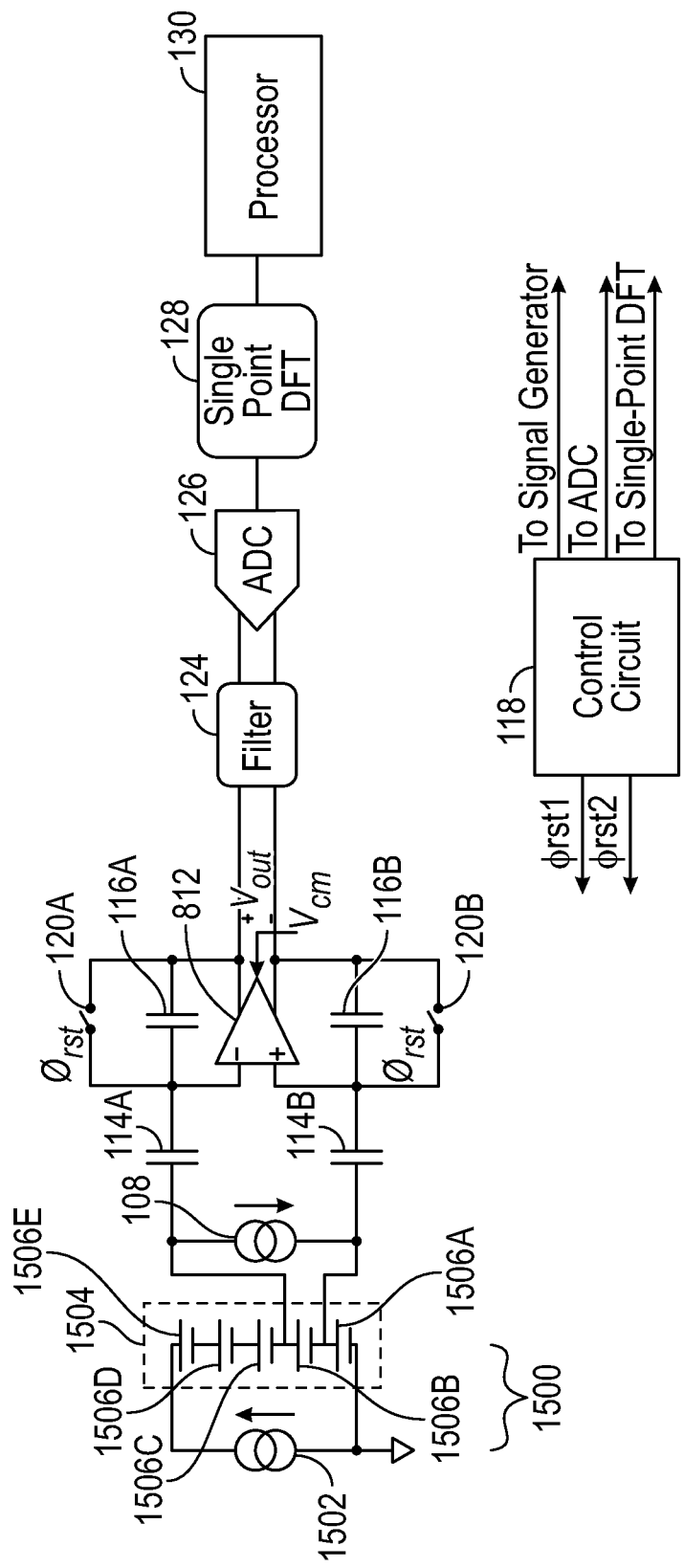
FIG. 14 is a schematic diagram of another example of a system for determining a state of health of one or more cells of a stack of energy storage cells.

FIG. 14 is a schematic diagram of another example of a system for determining a state of health of one or more cells of a stack of energy storage cells. FIG. 14 depicts an electrolyzer 1500, such as for the manufacture of hydrogen. The electrolyzer 1500 can include a DC current source 1502 that can inject a large current, e.g., 100A, into an energy storage device 1504. The energy storage device 1504 can include a stack of two or more energy storage cells, shown as cells 1506A-1506E in FIG. 14, coupled in series. The energy storage device 1500 can be an electrochemical cell stack, for example. The term "energy storage device", as used in this disclosure, can include devices used for electrolysis.

An excitation signal generator circuit 108 can generate and apply an excitation signal, such as an AC current, to the energy storage device 1504. In a non-limiting example, the excitation signal can be 100 mA and have a frequency between about 0.1 Hertz (Hz) and about 1 kHz. Unlike the common current excitation used in FIGS. 11 and 12, in the example shown in FIG. 14, the excitation signal generator circuit 108 can apply an excitation signal to individual ones of the cells 1506A-1506E of the energy storage device 1504.

The health of individual cells of the energy storage device 1504 can be monitored using a system 800, like the differential system 800 described above with respect to FIG. 8. Other systems described above can also be used. By monitoring the voltage across an individual cell, e.g., cell 1506B, of the energy storage device 1504 for a given current from the excitation signal generator circuit 108, the system 800 can measure the impedance of the individual cell.

In some examples, there can be a system 800 associated with individual ones of the cells 1506A-1506E. For example, for an energy storage device 1504 with cells 1506A-1506E, each cell can be associated with a corresponding system 800. In other examples, a multiplexer can couple a single system 800 to a plurality of cells 1506A-1506E.

FIG. 14 depicts individual cell excitation. However, common excitation (like in FIG. 12) can alternatively be implemented.

It should be noted that FIGS. 11-14 can be modified to include a second amplifier circuit for separate ping and pong phases, like in FIG. 2.

The various techniques described above can determine a state of health of a battery using a capacitor gain amplifier to provide an AC gain and block the DC voltage. A switch can be used to reset a feedback capacitor periodically to prevent the amplifier's output from becoming saturated from a leakage current at the negative input of the amplifier. Advantageously, these techniques can eliminate the need for an external DC blocking capacitor thereby allowing an embedded solution.

In addition, there is no phase shift when the techniques of this disclosure are used, due to the absence of a high pass RC filter.

VARIOUS NOTES

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The claimed invention is:

1. A system for determining a state of health of an energy storage device, the system comprising:
    a signal generator circuit configured to generate and apply an excitation signal to at least one cell of the energy storage device;
    a first capacitive gain amplifier circuit coupled with the signal generator circuit via an input capacitor of the first capacitive gain amplifier circuit, the first capacitive gain amplifier circuit configured to generate a first output signal in response to the excitation signal, the first capacitive gain amplifier circuit including a first inverting input terminal, wherein the input capacitor of the first capacitive gain amplifier circuit provides DC blocking without a need for another DC blocking capacitor coupled between the signal generator circuit and the at least one cell of the energy storage device;
    a control circuit configured to control operation of a first switch element coupled with the first inverting input terminal to control a DC bias voltage; and
    a back-end circuit configured to use the first output signal of the first capacitive gain amplifier circuit to determine a characteristic of the energy storage device that represents the state of health of the energy storage device.

2. The system of claim 1, comprising:
    a first channel including the first capacitive gain amplifier circuit; and
    a second channel including a second capacitive gain amplifier circuit coupled with the signal generator circuit and configured to generate a second output signal in response to the excitation signal, the second capacitive gain amplifier circuit including a second inverting input terminal,
    wherein the control circuit is configured to control operation of a second switch element coupled with the second inverting input terminal to control a DC bias voltage on the second inverting input terminal, and
    wherein the back-end circuit is further configured to use the second output signal to determine the characteristic of the energy storage device.

3. The system of claim 2, wherein the back-end circuit includes:
    a first filter circuit and a first analog-to-digital converter (ADC) circuit that forms part of the first channel; and
    a second filter circuit and a second ADC circuit that forms part of the second channel.

4. The system of claim 2, wherein the back-end circuit includes:
    an analog-to-digital converter (ADC) circuit shared by the first channel and the second channel.

5. The system of claim 2, wherein the excitation signal is an AC signal having a first frequency, wherein the control circuit is configured to control the operation of the first switch element and the second switch element at a second frequency, and wherein the second frequency is greater than the first frequency.

6. The system of claim 2, wherein the back-end circuit includes:
    a processor configured to:
    receive a first representation of the first output signal and a second representation of the second output signal;
    using the first representation and the second representation, determine a representation of an energy storage device response signal that is responsive to the excitation signal; and
    determine the characteristic of the energy storage device using the representation of the energy storage device response signal and the excitation signal.

7. The system of claim 6, wherein the first representation of the first output signal is a derivative of the energy storage device response signal and the second representation of the second output signal is a derivative of the energy storage device response signal.

8. The system of claim 1, wherein the signal generator circuit includes a waveform generator coupled with a current-mode digital-to-analog converter (IDAC) circuit, the waveform generator to generate and apply the excitation signal having a first phase relative to a channel select signal to produce a first energy storage device response signal, and the waveform generator to generate and apply the excitation signal having a second phase relative to the channel select signal to produce a second energy storage device response signal, the system comprising:
    a processor configured to perform an averaging of the first and second energy storage device response signals to reduce or eliminate a leakage current error.

9. The system of claim 8, wherein the excitation signal is an AC signal having a first frequency, wherein the channel select signal has a second frequency, wherein the control circuit is configured to control the operation of the first switch element and the second switch element at the second frequency, and wherein the second frequency is greater than the first frequency.

10. The system of claim 1, wherein the characteristic of the energy storage device that represents of the state of health of the energy storage device includes an impedance of the energy storage device.

11. The system of claim 1, wherein the back-end circuit configured to use the first output signal of the first capacitive gain amplifier circuit is configured to determine a magnitude and phase at a frequency of the excitation signal in the first output signal.

12. A system for determining a state of health of an energy storage device, the system comprising:
   a signal generator circuit configured to generate and apply an excitation signal to at least one cell of the energy storage device;
   a first channel including a first capacitive gain amplifier circuit, the first capacitive gain amplifier circuit coupled with the signal generator circuit and configured to generate a first output signal in response to the excitation signal, the first capacitive gain amplifier circuit including a first inverting input terminal;
   a second channel including a second capacitive gain amplifier circuit, the second capacitive gain amplifier circuit coupled with the signal generator circuit and configured to generate a second output signal in response to the excitation signal, the second capacitive gain amplifier circuit including a second inverting input terminal,
   a control circuit configured to control operation of:
   a first switch element coupled with the first inverting input terminal to control a first DC bias voltage; and
   a second switch element coupled with the second inverting input terminal to control a second DC bias voltage on the second inverting input terminal; and
   a back-end circuit configured to use the first output signal of the first capacitive gain amplifier circuit and the second output signal of the second capacitive gain amplifier circuit to determine a characteristic of the energy storage device that represents the state of health of the energy storage device.

13. The system of claim 12, wherein the excitation signal is an AC signal having a first frequency, wherein the control circuit is configured to control the operation of the first switch element and the second switch element at a second frequency, and wherein the second frequency is greater than the first frequency.

14. The system of claim 12, wherein the excitation signal is an AC signal having a frequency, and wherein the control circuit is configured to disable operation of the first channel and enable operation of the second channel based on the frequency of the AC signal.

15. The system of claim 12, wherein the signal generator circuit includes a waveform generator coupled with a current-mode digital-to-analog converter (IDAC) circuit, the waveform generator to generate and apply the excitation signal having a first phase relative to a channel select signal to produce a first energy storage device response signal, and the waveform generator to generate and apply the excitation signal having a second phase relative to the channel select signal to produce a second energy storage device response signal, the system comprising:
   a processor configured to perform an averaging of the first and second energy storage device response signals to reduce or eliminate a leakage current error.

16. The system of claim 12, wherein the characteristic of the energy storage device that represents of the state of health of the energy storage device includes an impedance of the energy storage device.

17. A method of determining a state of health of an energy storage device, the method including:
   generating, using a signal generator circuit, and applying an excitation signal to at least one cell of the energy storage device;
   coupling a first capacitive gain amplifier circuit with the signal generator circuit via an input capacitor of the first capacitive gain amplifier circuit and using the first capacitive gain amplifier circuit to generate a first output signal in response to the excitation signal, the first capacitive gain amplifier circuit including a first inverting input terminal;
   providing DC blocking via the input capacitor of the first capacitive gain amplifier circuit provides without a need for another DC blocking capacitor coupled between the signal generator circuit and the at least one cell of the energy storage device;
   controlling operation of a first switch element coupled with the first inverting input terminal to control a first DC bias voltage; and
   determining, using the first output signal of the first capacitive gain amplifier circuit, a characteristic of the energy storage device that represents of the state of health of the energy storage device.

18. The method of claim 17, wherein the characteristic of the energy storage device that represents of the state of health of the energy storage device includes an impedance of the energy storage device.

19. The method of claim 17, wherein a first channel includes the first capacitive gain amplifier circuit, the method comprising:
   using a second capacitive gain amplifier circuit in a second channel to generate a second output signal in response to the excitation signal, the second capacitive gain amplifier circuit including a second inverting input terminal; and
   controlling operation of a second switch element coupled with the second inverting input terminal to control a DC bias voltage on the second inverting input terminal, and
   wherein determining the characteristic of the energy storage device that represents of the state of health of the energy storage device includes using the second output signal of the second capacitive gain amplifier circuit.

20. The method of claim 19, wherein the excitation signal is an AC signal having a first frequency, the method comprising:
   controlling the operation of the first switch element and the second switch element at a second frequency, and wherein the second frequency is greater than the first frequency.

* * * * *